United States Patent [19]

Kuesters

[11] Patent Number: 4,855,801
[45] Date of Patent: Aug. 8, 1989

[54] TRANSISTOR VARACTOR FOR DYNAMICS SEMICONDUCTOR STORAGE MEANS

[75] Inventor: Karl-Heinz Kuesters, Munich, Fed. Rep. of Germany

[73] Assignee: Siemens Aktiengesellschaft, Berlin and Munich, Fed. Rep. of Germany

[21] Appl. No.: 74,334

[22] Filed: Jul. 16, 1987

[30] Foreign Application Priority Data

Aug. 22, 1986 [DE] Fed. Rep. of Germany ....... 3628500

[51] Int. Cl.$^4$ ........................................... H01L 29/78
[52] U.S. Cl. .................................... 357/23.6; 357/41; 357/54; 357/59; 365/149; 365/182
[58] Field of Search .................... 357/23.6, 41, 54, 59; 365/149, 182

[56] References Cited

U.S. PATENT DOCUMENTS

4,356,040 12/1982 Fu et al. .
4,649,406 3/1987 Takemae et al. .................. 357/23.6
4,754,313 6/1988 Takemae et al. .................. 357/23.6

FOREIGN PATENT DOCUMENTS

0112670 7/1984 European Pat. Off. .
0161850 11/1985 European Pat. Off. .

OTHER PUBLICATIONS

IEEE Transactions on Electron Devices, vol. Ed-29 Mar. (1982), No. 3, New York, U.S.A.-Quadruply Self-Aligned Stacked High-Capacitance RAM Using Ta$_2$O$_5$ High-Density VLSI Dynamic Memory—Ohta, Yamada, Shimizu and Tarui, pp. 368–376.
J. Sturm et al, IEEE Electron Device Letters, vol. Ed1-5, No. 5, May 1984 "A Three-Dimensional Folded Dynamic RAM in Beam-Recrystallized Polysilicon", pp. 151–153.
IEEE Journal of Solid–State Circuits, vol. SC20, No.1 Feb., A Capacitance-Coupled Bit Line Cell Taguchi, Ando, Hijiya, Nakamura, Enomoto and Yabu, pp. 210–215, Feb. 1985.
IEEE Transactions on Electron Devices, vol. ED-27, No. 8, Aug. 1980, A 5-V Only 16-kbit Stacked-Capacitor MOS RAM Koyanagi, Sakai, Ishihara, Tazunoki, Hashimoto, pp. 1596–1601.

*Primary Examiner*—Joseph E. Clawson, Jr.
*Attorney, Agent, or Firm*—Hill, Van Santen, Steadman & Simpson

[57] ABSTRACT

A transistor varactor for dynamic semiconductor storage means which are formed on a doped silicon substrate having an high integration density and which includes one field effect transistor which has source and drain and a gate and a varactor overlaps the gate electrode and is formed as a stacked capacitor. The gate electrode and the varactor are electrically isolated from each other by insulating layers and the contact of the source zone is electrically isolated from the gate electrode by the insulating layers and the upper polysilicon layer of the varactor formed by oxidation of the side portions of the polysilicon layer. The contact of the source zone adjusts to the gate electrode and to the polysilicon layer in that the distance of the contact of the source zone relative to the gate electrode and the polysilicon layer is independent of the photographic accuracy. A buried contact between the polysilicon layer and the drain zone is self-adjusted relative to the gate electrode.

2 Claims, 4 Drawing Sheets

TRANSISTOR VARACTOR FOR DYNAMICS SEMICONDUCTOR STORAGE MEANS

BACKGROUND OF THE INVENTION

1. Field of the Invention

The invention relates to a transistor varactor structure for a dynamic semiconductor storage means formed on a doped silicon substrate.

2. Description of the Prior Art

A basic structure for dynamic conductor storage means, referred to as DRAMs, consists of a transistor varactor cell. The transistor is designed as a MOS-FET and can be externally controlled by way of externally contacted source and drain regions. The drain region is electrically connected to one electrode side of the varactor and the second electrode side is externally controlled by a contact terminal. In the case of transistor varactors with packing densities of one megabit per square centimeter, the varactors are generally of a planar form and the varactor consists of a doped layer of silicon substrate and a planar polysilicon layer separated by a dielectric layer. In order to increase the packing density of the dynamic storage means (DRAMs) due to the smaller cell surface areas available and due to capacitive values of 30–50 pF which are required for resistance to interference, new varactor design concepts are needed. One possibility of meeting these demands, in other words, reduced space requirements and minimum capacitance of the varactor, consists in constructing the varactor as a stacked capacitor. The stacked capacitor consists of two polysilicon layers with a separating dielectric layer which are not formed as planar layers, but overlap the gate electrode of the field effect transistor.

It is known that a stacked capacitor can be used to increase the degree of integration of dynamic semiconductor stores as, for example, as described in the article IEEE Transaction on Electron Devices Volume ED-27 No. 8, August 1980 entitled "A 5 V only 16 kbit Stacked-Capacitor MOS Ram" by Mitsumasa Koyanagi, Yoshio Sakai, Masamichi Ishihara, Masanori Tazunoki and Norikazu Hashimoto, pages 1596 to 1601. As described in this publication, a stacked capacitor is constructed from a two layer polysilicon formation with a silicon nitride layer $Si_3N_4$ (generally Poly Si-$Si_3N_4$-Poly Si or Al). FIG. 1 of this publication shows three stacked capacitor cell structures (A) "top capacitor" (B) "intermediate capacitor" and (C) "bottom capacitor". In embodiments A and B, the gate electrodes are partially overlapped by the stacked capacitors. In embodiment A the three-layer structure is a Poly Si-$Si_3N_4$-Al-layer, whereas an embodiment B it is a Poly Si-$Si_3N_4$-Poly Si-layer. In embodiment C, the "bottom capacitor"—the gate electrode partially covers the stacked capacitor which consists of a Poly Si-$Si_3N_4$-Poly Si-structure.

In the past, various other cell structures have been described which increase the degree of integration such as, for example, the CCB-cell (capacitance-coupled bit line cell). Such CCB-cell is discussed in the publication of the IEEE Journal of Solid State Circuits, Volume SC-20, No. 1, "A Capacitance-Coupled Bit Line Cell" by Masao Taguchi, Satoshi Ando, Shimpei Hijiya, Tetsuo Nakamura, Seiji Enomoto and Takashi Yabu, at pages 210 through 215. The principle of this cell consists of a capacitively coupled terminal of the source or drain regions. FIG. 1 of this publication gives a detailed explanation of the composition of the structure which consists of a three layer polysilicon arrangement. The first layer forms the gate electrode and the second and third layers form the varactor with a separating dielectric layer.

Another possibility of increasing the degree of integration is disclosed in the article "IEEE Electron Device Letters", Volume EDL-5, No. 5, May 1984, "A Three-Dimensional Folded Dynamic RAM in Beam-Recrystallized Polysilicon" by J. C. Sturm, M. D. Giles and J. F. Gibbons at pages 151 to 153. In this article, the transistor varactor arrangement is compressed wherein the first polysilicon layer of the varactor surrounds the other in a U-formation and the transistor is arranged above the second polysilicon layer of the varactor as illustrated in FIGS. 1 and 2. This arrangement is referred to as a dynamic folded RAM cell.

Other possibilities exist in the use of the "Hi-C" RAM-Cell (high capacity RAM Cell) described in SZE, VLSI Technology, at pages 476–478 published by McGraw-Hill, New York (1983). In this article, an arsenic implantation and a deeper extending boron implantation are done under the varactor so as to maximize the capacitance of the varactor by reduced cell surface areas. The implantation steps result in an additional blocking layer capacitance which increases the charge capacitance of the varactor. So as to produce a stacked capacitor and a transistor varactor cell, it has been previously necessary to utilize specific design spacings between the various layers due to adjustment tolerances of the individual layers relative to each other and so as to maintain the dimensional accuracy of the structural arrangement. If the spacings are not maintained, there is danger that a short circuit will occur between the layers. In a CCB cell concept due to the capacitive coupling of the source or drain zone, there is a danger of increasing the voltage between the terminals of the transistor at the instant when changes occur in the potential of the capacitive terminal contact. This is particularly critical in the case of transistor channel lengths of 0.7 to 1 $\mu$m.

SUMMARY OF THE INVENTION

It is an object of the invention to increase integration density utilizing a novel cell configuration of the transistor varactor arrangement which can be produced with a simple process.

The object is accomplished by use of a transistor varactor arrangement for dynamic semiconductor storage means on a doped silicon substrate by providing at least one field effect transistor with a source region and a drain region arranged in the doped silicon substrate and with a gate electrode which is covered by insulating layers wherein the source zone can be directly contacted from the outside by way of a terminal. At least one varactor overlaps the gate electrode of the field effect transistor and is designed as a stacked capacitor which consists of two doped polysilicon layers separated by a dielectric layer and the upper polysilicon layer can be contacted from the outside and overlaps the lower polysilicon layer and the side portions of the lower polysilicon layer and covers the gate electrode and that the upper polysilicon layer is insulated from the terminal to the source region by an insulating layer along the side portions of the upper doped polysilicon layer and the lower polysilicon layer partially overlies the gate electrode and is insulated from the gate electrode G by oxide layers and is connected to the drain region of the field effect transistor.

So as to increase the integration density, the lower portion of the gate electrode is covered by a dielectric layer and the other sides of the gate electrode are covered by a silicon oxide layer and the gate electrode is covered by a nitride, Teos (tetraethylorthosilicate) or Teos-nitride-layer.

The advantages of the invention are that a gain in the varactor capacitance results due to the larger overlap surfaces of the two polysilicon layers of the varactor. A simple production process allows all the design parameters except the overlap spacing of the upper and lower polysilicon layers of the varactor to be independent of the adjustment tolerances of the photographic techniques utilized.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which:

DESCRIPTION OF THE PREFERRED EMBODIMENTS

Figure 1:
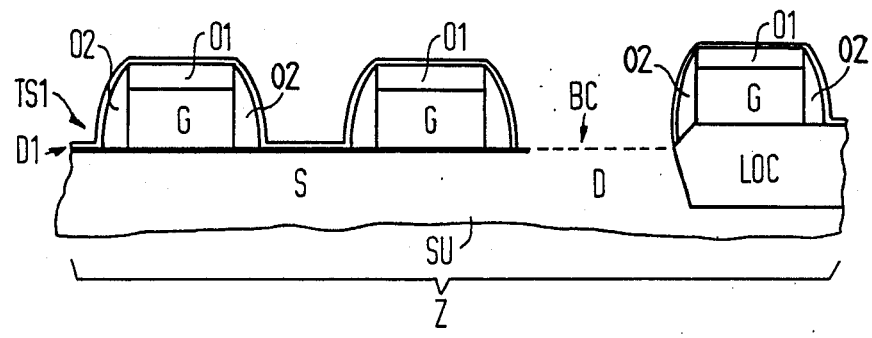
FIGS. 1–5 are sectional views through a cell array showing the process for producing the transistor varactor arrangement of the invention.

The process for constructing the invention is illustrated in the FIGS. and FIG. 1 illustrates a substrate SU in which insulating layers LOC are used to isolate active zones from each other are produced on the substrate SU by LOCOS technique (local oxidation of silicon). Next, a dielectric layer D1 is applied to the cell array Z and the gate electrodes G of the field effect transistor are formed from a doped polysilicon layer at the desired locations. An oxide layer 01 is deposited over the polysilicon layer of the gate electrodes G and is formed together with the gate electrodes G.

Since due to the increase in integration density, the gate electrodes G are to be surrounded completely by insulating layers, using spacer technology (deposition of silicon oxide) onto the entire surface and anistropic etching such that oxides remain at the side portions and the side surfaces are encased by an oxide casing 02. Using a CVD process (chemical vapor deposition) a thin Teos- (tetraehylorthosilicate), nitride- or Teos/nitride-layer (TS1) is deposited over the entire cell array Z including the gate electrodes G which are insulated completely. Later in the process, this layer serves to form the second polysilicon layer which has not yet been applied by an etching process without etching into the source regions of the cell array which are not covered by the second polysilicon layer. The Teos-(tetraethylorthosilicate) nitride- or Teos/nitride-layer (TS1) is removed where the second polysilicon, layer yet to be produced is to electrically contact the substrate SU of the cell array Z. This zone is called a buried contact BC, since it can no longer be connected to the exterior. The Teos- nitride- or TEos/nitride layer (TS1) is also removed from the zones adjoining the buried contact BC such that in the event of a misadjustment of the photographic technique used to form the buried contact BC the contact surface is fully exposed by etching.

Figure 2:
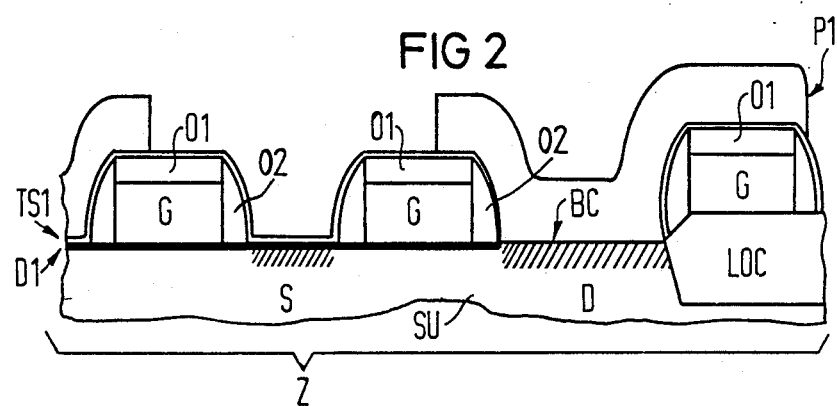

FIG. 2 illustrates a polysilicon layer P1 which will form the lower electrode of the varactor which is deposited onto the Teos- (tetraethylorthosilicate), nitride- or Teos/nitride-layer (TS1) of the cell array. By flat implantation or another method of doping, such polysilicon layer P1, it is made conductive and then is formed such that the gate electrode of the field effect transistor is partially covered. So as to make the source region S and the drain region D of the field effect transistor conductive, the source region S in the cell array located between the gate electrodes G is doped by implantation or another method of doping and the drain region D is doped below the buried contact BC by diffusion from the doped polysilicon layer P1.

Figure 3:
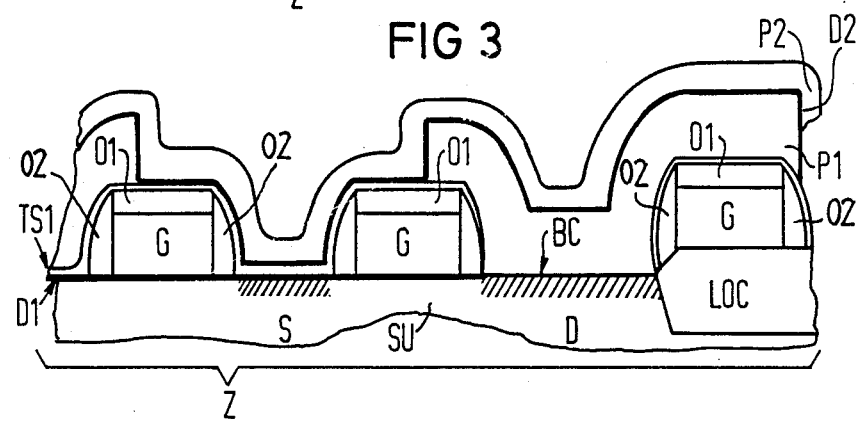

FIG. 3 illustrates the next process step wherein the dielectric layer D2 which is required between the doped polysilicon layer P1 of the varactor and the polysilicon layer P2 which is to be applied in a subsequent step is deposited by oxidation or by CVD (chemical vapor deposition) onto the entire cell array C. Then a second polysilicon layer P2 is deposited onto the entire cell array Z and is doped in a doping process. After being formed at a later process step, the doped polysilicon layer P2 together with the dielectric D2 and the doped polysilicon layer P1 form the varactor which is also called a stacked capacitor due to its structure.

Figure 4:
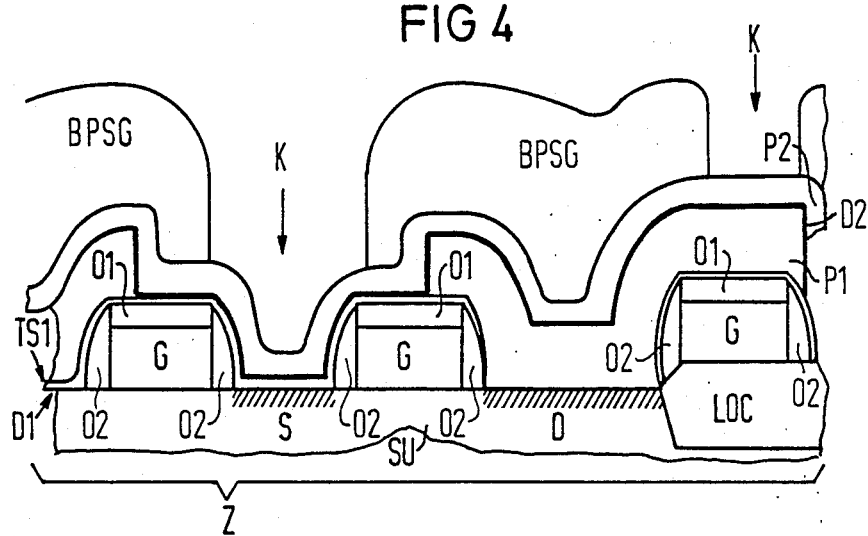

FIG. 4 illustrates a continuation of the process wherein by CVD (chemical vapor deposition), a Teos-(tetraethylorthosilicate) and a boron-phosphorous-silicate glass layer (BPSG) are deposited as insulating layers and the boron-phosphorous silicate glass layer BPSG serves to round off the edges formed on the cell array Z during previous process steps for final terminal metallization. The insulating layer BPSG is removed in the region of the terminal contacts K. The contact hole for the terminal contact K to the source region S overlaps the gate electrode G and can be larger than the contact surface to the source region S even in the event of a misadjustment of the photographic technique used to form the terminal contact K and the entire surface area between the oxide side surfaces 02 of the gate electrodes G can be used as contact surfaces.

Figure 5:
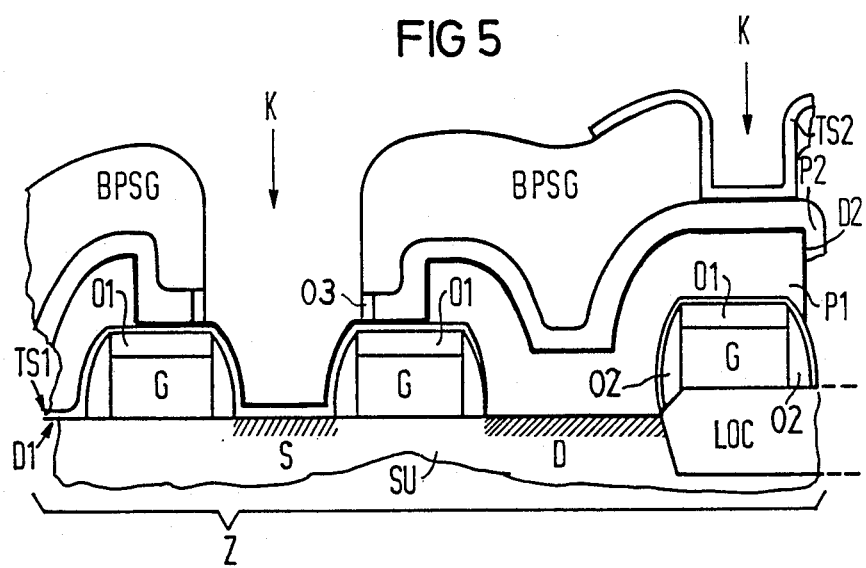

FIG. 5 illustrates how for later etching of the doped polysilicon layer P2 in the region of the terminal contact K above the source region S that a further Teos- nitride- or Teos/nitride-layer (TS2) is deposited by a CVD-process over the cell array Z and is removed by an isotropic etching process above the terminal contact K of the source region S. Then in a further etching step, the doped polysilicon layer P2 is removed in the region of the terminal contact K of the source region S without damaging the remainder of the polysilicon layer P2. The etching process exclusively stops at the dielectric layer D1 and the Teos/nitride-layer TS1. So as to prevent the upper doped polysilicon layer P2 from being electrically connected to the terminal contact K of the source region S, the sides 03 of the upper doped polysilicon layer P2 are oxidized in the region of the terminal contact K of the source regions S. In this process step, oxidation of the source diffusion region S is prevented by the Teos, nitride or Teos/nitride-layer TS1 and the dielectric layer D1. Then with a short anisotropic etching step, the Teos tetraethylorthosilicate, nitride- or Teos/nitride-layer (TS2) and any thin oxide above it are removed. Oxide residues remaining in the region of the terminal contacts K are etched away and then the terminal contacts K are metallized.

Figure 6:
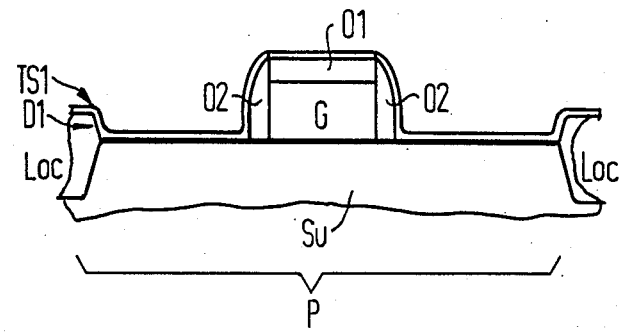
FIGS. 6–10 are sectional views of a transistor in the peripheral region which are simultaneously produced in the process of the invention.

FIG. 6 illustrates all of the process steps described in FIG. 1 except for the last step to form the peripheral zone P but it does not have a stacked capacitor and buried contact BC is not required and the Teos (tetraethylorthosilicate) nitride- or Teos/nitride-layer TS1 forms a closed surface above the peripheral zone P. It is to be realized that the peripheral zone P is formed adjacent to the cell array zone Z illustrated in FIG. 1.

Figure 7:
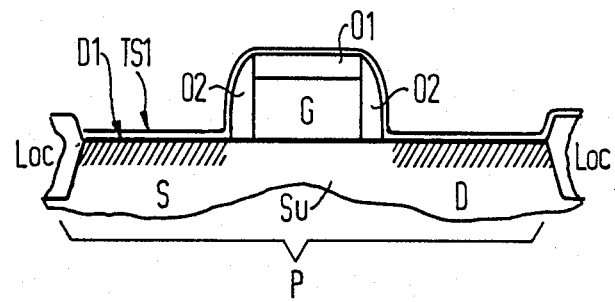

FIG. 7 illustrates the process steps corresponding to those described with respect to FIG. 2 on the peripheral zone with the following exceptions. Since no varactor is formed in the peripheral zone P, the doped polysilicon layer P1 can be entirely removed. Instead of diffusion from the doped polysilicon layer P1 which was used in FIG. 1 to dope the drain region D, the source region S and the drain zone D are commonly doped with a doping process as, for example, implantation.

Figure 8:
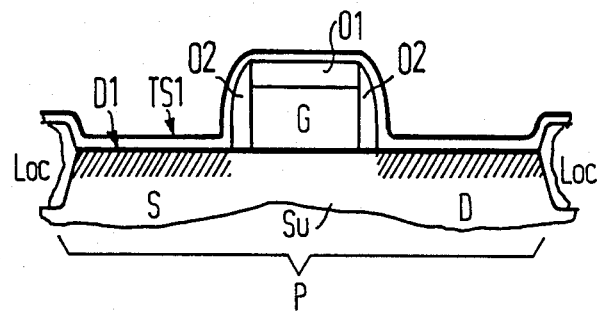

FIG. 8 illustrates the process steps which correspond to those of FIG. 3 except the doped polysilicon layer P2 for the varactor and the Teos- (tetraethylorthosilicate), nitride- or Teos/nitride layer TS1 and the dielectric layer D1 are removed in the region of the source region S and the drain region D.

Figure 9:
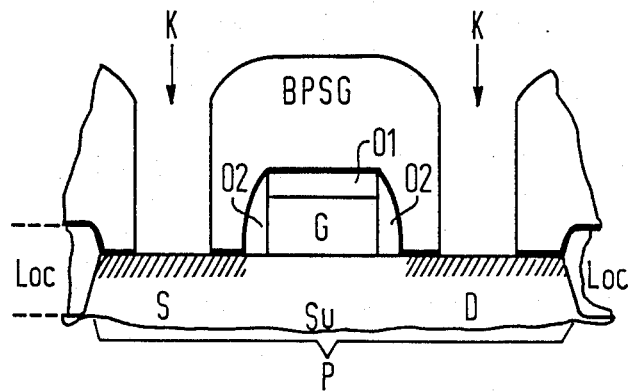

FIG. 9 illustrates the peripheral region wherein by using a CVD process (chemical vapor deposition) a Teos-(tetraethylorthosilicate), and a boron phosphorous silicate glass layer (BPSG) are deposited as insulating layers and removed in the zones of the terminal contacts K for the source region S in the drain region D.

Figure 10:
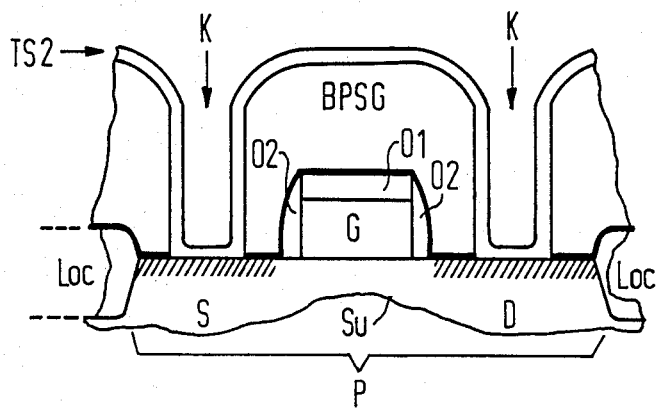

FIG. 10 illustrates steps for the following etching of the doped polysilicon layer P2 above the source region S of the cell array Z in FIG. 5 and a further Teos-(tetraethylorthosilicate), nitride- or Teos/nitride-layer (TS2) is deposited over the peripheral zone P with a CVD process (chemical vapor deposition). This layer prevents oxidation of the source-drain-diffusion zone SS.DD in the terminal contacts K during the oxidation for the insulation of the sides of the polysilicon layer P2 illustrated in FIG. 5. Then in a short anistropic etching step, the Teos- (tetraethylorthosilicate), nitride- or Teos/nitride-layer (TS2) and any thin oxide above it are removed. Oxide residues remaining in the region of the terminal contacts K of the source region S and the drain region D in the periphery P are etched away and then the terminal contacts K are metallized.

Although the invention has been described with respect to preferred embodiments, it is not to be so limited as changes and modifications may be made therein which are within the full intended scope of the invention as defined by the appended claims.

I claim as my invention:

1. A transistor varactor arrangement for dynamic semiconductor memories on a doped silicon substrate (SU), comprising: at least one field effect transistor having a source (S) region and drain (D) region lying in said doped silicon substrate and having a gate electrode (G) covered on all sides with insulating layers (01,02), said source (S) region being directly contactable from the outside by a terminal (K), and at least one varactor overlapping the gate electrode (G) of the field effect transistor, said at least one varactor being formed as a stacked capacitor and composed of two doped polysilicon layers (P1, P2) with a separating dielectric layer (D2), whereby the upper polysilicon layer (P2) is contactable from the outside and overlaps the lower polysilicon layer (P1) and the sidewalls of the lower polysilicon layer (P1) and overlaps the majority part of the gate electrode (G), an oxide layer (03) produced by oxidation of the sidewalls of the upper polysilicon layer (P2) is provided for insulation of the sidewalls of the upper polysilicon layer (P2) from the terminal (K) to said source region (S), an insulation layer (BPSG) formed on the upper polysilicon layer (P2) except for the contact region (K) and on the oxide layer (03) located on the sidewalls of the upper polysilicon layer (P2), the lower polysilicon layer (P1) partially overlaps the gate electrode (G) and is connected to the drain (D) region of the field effect transistor, and a layer (TS1) containing nitride and/or tetraethylorthosilicate covering said gate electrode (G) which is covered on all sides by said insulating layers (01, 02)

2. A transistor varactor arrangement according to claim 1, wherein a hole (K) for the terminal to said source region (S) overlaps said gate electrode (G).

* * * * *